United States Patent
Ma et al.

(10) Patent No.: US 7,695,288 B2
(45) Date of Patent: Apr. 13, 2010

(54) LAND GRID ARRAY (LGA) SOCKET WITH CELLS AND METHOD OF FABRICATION AND ASSEMBLY

(75) Inventors: Xiaoqing Ma, Gilbert, AZ (US); Tieyu Zheng, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/215,296

(22) Filed: Jun. 25, 2008

(65) Prior Publication Data

US 2009/0325398 A1 Dec. 31, 2009

(51) Int. Cl.
*H01R 12/00* (2006.01)

(52) U.S. Cl. .................................... 439/70
(58) Field of Classification Search .............. 439/70, 439/66, 71
See application file for complete search history.

(56) References Cited

U.S. PATENT DOCUMENTS

| | | | | |
|---|---|---|---|---|
| 5,380,210 A * | 1/1995 | Grabbe et al. | ........... | 439/66 |
| 5,427,535 A * | 6/1995 | Sinclair | ........... | 439/66 |
| 6,644,985 B2 * | 11/2003 | Wilson et al. | ........... | 439/83 |
| 6,733,303 B2 * | 5/2004 | Maldonado et al. | ........... | 439/66 |
| 6,916,186 B2 * | 7/2005 | Szu et al. | ........... | 439/86 |
| 6,945,788 B2 * | 9/2005 | Trout et al. | ........... | 439/66 |
| 7,044,746 B2 * | 5/2006 | Copper et al. | ........... | 439/66 |
| 7,059,869 B2 * | 6/2006 | Wertz et al. | ........... | 439/71 |
| 7,097,463 B2 * | 8/2006 | Hsiao et al. | ........... | 439/70 |
| 7,261,572 B2 * | 8/2007 | Zheng | ........... | 439/70 |
| 7,448,877 B1 * | 11/2008 | Pennypacker et al. | ........... | 439/66 |
| 7,448,883 B2 * | 11/2008 | Alden et al. | ........... | 439/91 |
| 2004/0077202 A1 * | 4/2004 | Copper et al. | ........... | 439/241 |
| 2005/0191873 A1 * | 9/2005 | Wertz et al. | ........... | 439/68 |
| 2005/0233614 A1 * | 10/2005 | Gattuso et al. | ........... | 439/70 |
| 2006/0046531 A1 * | 3/2006 | Sinclair | ........... | 439/70 |
| 2006/0094265 A1 * | 5/2006 | Zheng | ........... | 439/69 |
| 2006/0189177 A1 * | 8/2006 | Goodman et al. | ........... | 439/70 |
| 2006/0258184 A1 * | 11/2006 | Alger et al. | ........... | 439/71 |
| 2007/0082513 A1 * | 4/2007 | Zheng | ........... | 439/70 |

* cited by examiner

*Primary Examiner*—T C Patel
*Assistant Examiner*—Vladimir Imas
(74) *Attorney, Agent, or Firm*—Blakely, Sokoloff, Taylor & Zafman LLP

(57) ABSTRACT

An LGA socket assembly comprising individual sockets cells, the methods of fabricating and assembling the socket cells into a socket assembly. In an embodiment of the invention, each socket cell comprises an insulative body and a wire. The insulative body is formed around the wire. A first portion of the wire extends from the top surface of the insulative body to form contact tip. A second portion of the wire extends from the bottom surface of the insulative body to form contact paddle. Socket cells are aligned to form a socket assembly.

19 Claims, 9 Drawing Sheets

LAND GRID ARRAY (LGA) SOCKET WITH CELLS AND METHOD OF FABRICATION AND ASSEMBLY

BACKGROUND OF INVENTION

1. Field

The present invention relates to integrated circuit component second level (package-to-board) interconnection. More specifically, the invention relates to an Land Grid Array (LGA) socket with smaller contact pitch as compared to known LGA sockets, and the method of fabricating and assembling the socket.

2. Discussion of Related Art

A component socket is employed to couple an integrated circuit package to a circuit board. Pin Grid Array (PGA) and Land Grid Array (LGA) packages require a component socket to be connected to a circuit board because PGA and LGA packages do not have solder balls at the bottom of the package to be soldered to a circuit board directly.

FIG. 1A shows the top view of a known LGA socket housing 100. Socket housing 100 includes contact carrier 121. FIG. 1B shows a perspective view of contact carrier 121 having a plurality of pockets 126. Pockets 126 house electrically conductive contacts 124. The upper portion of contact 124 connects with the lands of LGA package while the bottom portion of contact 124 is soldered to solder ball 128. Walls 122 of contact carrier 121 provide structural support to contacts 124 and prevent contacts 124 from touching each other. FIG. 1C illustrates the top view of four adjacent pockets 126 defined by walls 122 of contact carrier 121 (contacts 124 are not shown here). Walls 122 are illustrated to assume wall thickness 146. Contacts 124 housed within pockets 126 of pocket width 144 would define socket pitch 142.

As semiconductor devices are designed to pack more transistors in the silicon and more than one silicon chip on the package, the number of second level interconnects of the integrated circuit package grows tremendously. Package interconnect pitch reduction is required to avoid substantial increase in package size. However, historically, interconnect and socket pitches reductions have progressed slower than the increase of the number of interconnects. Pitch reduction of known LGA sockets, among other factors, is limited by walls 122 of contact carrier 121 and the void space consumed by pockets 126 of contact carrier 121.

DETAILED DESCRIPTION OF ILLUSTRATED EMBODIMENTS

The present invention is directed to an LGA component socket assembly that is based on a structural and design concept entirely different from known LGA sockets. The socket of the present invention is made up of a plurality of individual entities referred to as "socket cells". Socket cells are physically interconnected and housed within a frame to form a monolithic body. More specifically, each socket cell comprises a conductive wire and a non-conductive carrier body formed around the conductive wire. The conductive wire and carrier body are respectively referred to as "contact" and "insulative body" throughout this specification. Contact carrier in known LGA sockets is not required for the socket assembly according to the present invention. Hence, socket pitch will not be limited by the thickness of the walls of contact carrier and the effective socket pitch may be reduced.

Reference throughout the specification to "one embodiment" or "an embodiment" means that a particular feature, structure, characteristic or step described in connection with the embodiment is included in at least one embodiment of the present invention. Thus, the appearance of said phrases in various places throughout the specification does not necessarily all refer to the same embodiment unless otherwise expressed. Furthermore, the particular features, structures, characteristics or steps recited in the specification may be combined in any suitable manner in one or more embodiments.

Figure 2A:
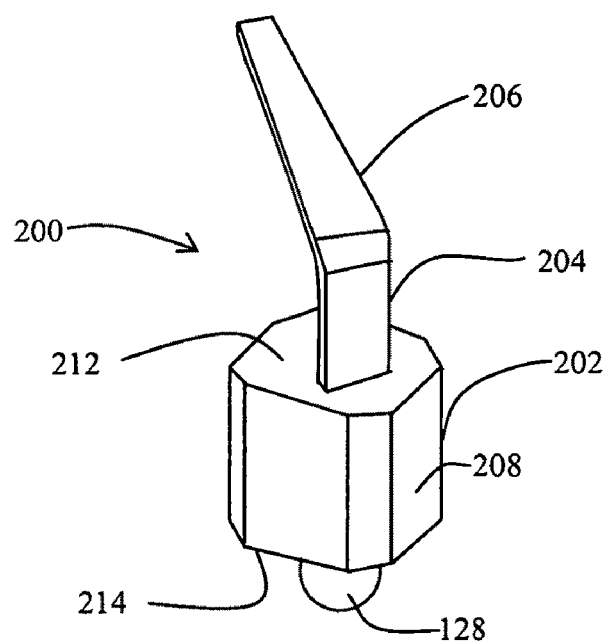
FIGS. 2A and 2B respectively illustrate the perspective and side views of an LGA socket cell according to an embodiment of the invention.
Figure 2B:
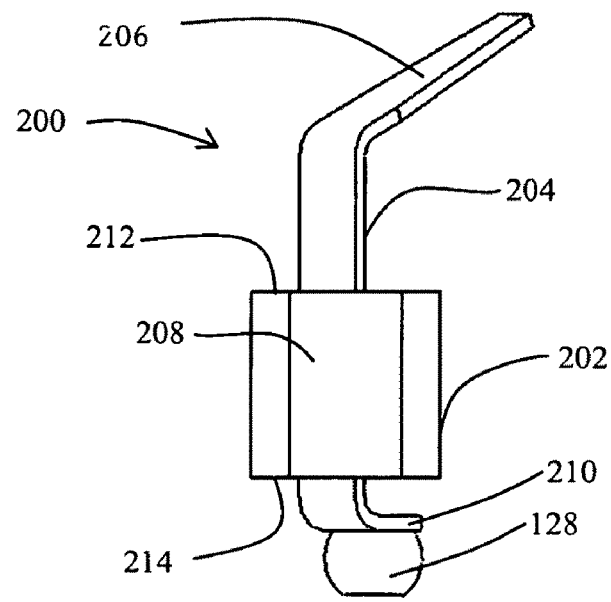

FIGS. 2A and 2B illustrate the structure and parts of socket cell 200 according to an embodiment of the invention from different views. Socket cell 200 comprises contact 204 and insulative body 202. Insulative body 202 encapsulates a portion of contact 204. Insulative body 202 has a three-dimensional shape. Insulative body 202 performs various functions. Insulative body 202 provides structural rigidity to contacts 204. Insulative body 202 has sufficient thickness to space out the distance between contacts 204. Insulative body 202 therefore prevents electrical shorts between contacts 204 and eliminates the need for contact carrier 121 in known LGA sockets. In an embodiment, insulative body 202 may be made from polycarbonate material or liquid crystal polymer.

Contact 204 is electrically conductive. The choice of material depends on, among other factors, the desired electrical characteristics, mechanical and heat transfer properties of the socket. In an embodiment, contact 204 may be made from copper alloy. Contact 204 may be further coated with nickel alloy.

Still referring to FIGS. 2A and 2B, the portion of contact 204 protruding from top surface 212 of insulative body 202 may be known as contact tip 206. Contact tips 206 engage with the lands of an LGA package. Contact tips 206 are designed to incline at an angle to maintain good contact with the lands of an LGA package. An embodiment of contact tip 206 has cantilever-type design as illustrated in FIGS. 2A and 2B. Referring to FIG. 2B, the portion of contact 204 protruding from bottom surface 214 of insulative body 202 may be referred to as contact paddle 210. Contact paddle 210 is soldered to solder ball 128. An embodiment of contact paddle 210 has J-lead design as shown in FIG. 2B.

FIG. 2A shows an embodiment of socket cell 200 with an octagonal insulative body 202. The length of the edges of octagonal insulative body 202 may be identical (regular octagon) or different (irregular octagon). The edges of insulative body 202 assist the alignment between socket cells 200 to form a monolithic body. In another embodiment, insulative body 202 may be designed to have other polygonal shapes such as hexagon. The shape of insulative body 202 is a design factor in determining the desired effective socket pitch of the socket assembly.

Figure 2C:
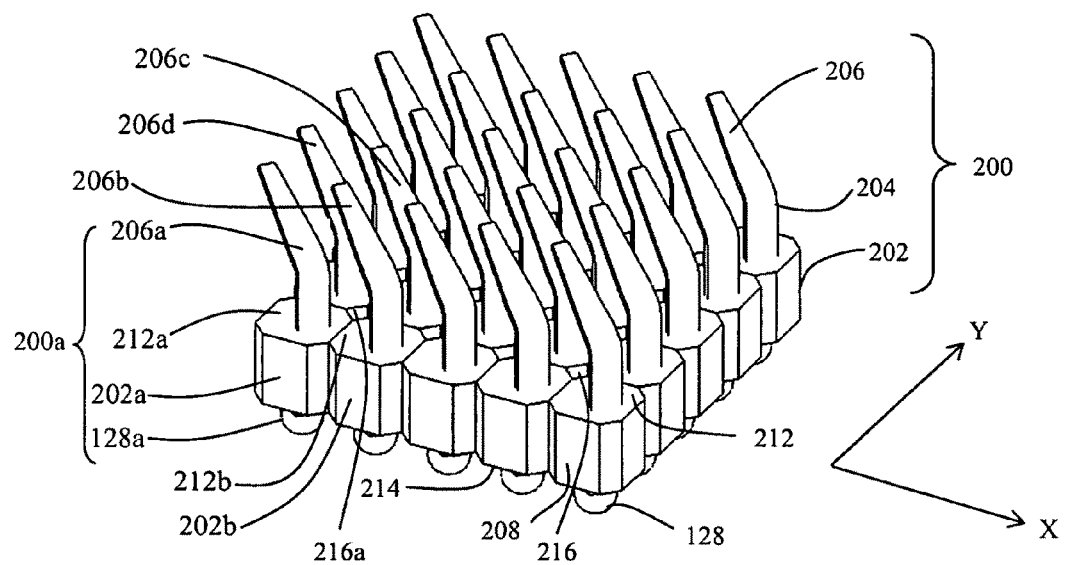
FIG. 2C illustrates the perspective view of a plurality of socket cells aligned together to form a monolithic body according to an embodiment of the invention.

Individual socket cells 200 are brought together and aligned to form a monolithic body as shown in FIG. 2C. FIG. 2C illustrates the perspective view of a plurality of aligned socket cells 200 according to an embodiment of the invention. Vertical walls 208 of insulative body 202 are placed facing directly to and against vertical walls 208 of adjacent insulative bodies 202 such that contact tips 206 point to a common direction. By aligning socket cells 200 as depicted in FIG. 2C, an array of contacts 204 spanning in X and Y directions with uniform socket pitch can be attained. Insulative bodies 202 of four adjacent aligned socket cells 200 may define through cavity 216. In the embodiment as shown in FIG. 2C, four socket cells 200a, 200b, 200c, 200d are adjacent to each other and collectively define through cavity 216a.

Figure 2D:
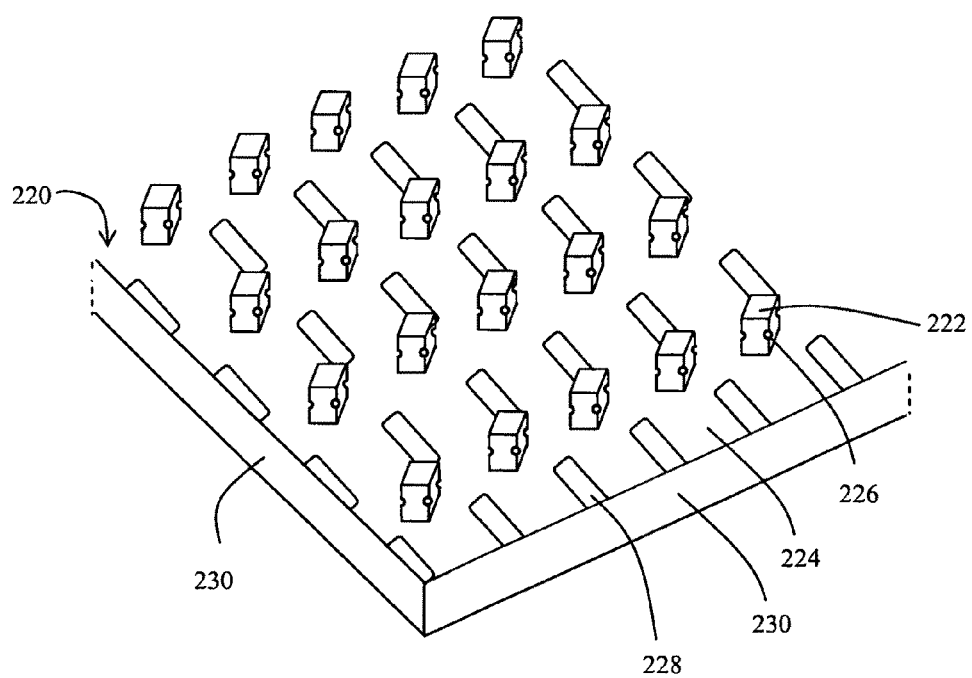
FIG. 2D illustrates the perspective view of a first embodiment of link tool to align socket cells according to an embodiment of the invention.
Figure 2E:
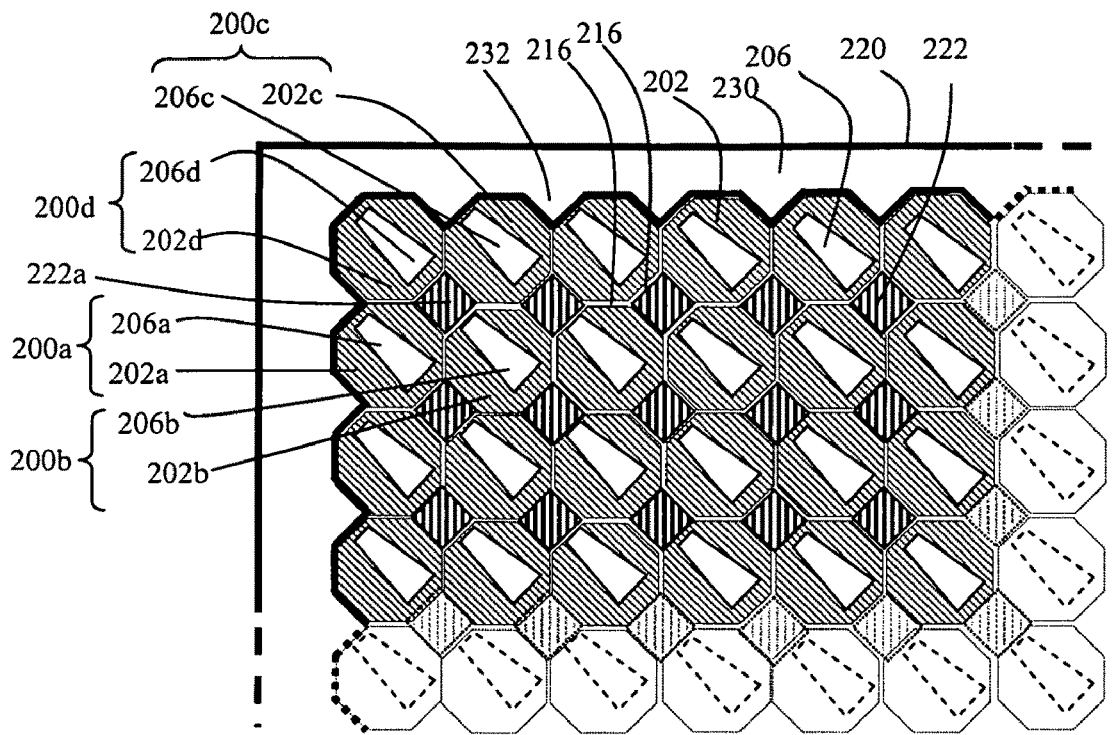
FIG. 2E illustrates the top view of a corner of a first embodiment of link tool with aligned socket cells placed on the link tool according to an embodiment of the invention.

According to an embodiment of the invention, socket cells 200 are aligned with the assistance of a tool conveniently referred to as link tool 220. The perspective view of link tool 220 (before being filled with socket cells 200) according to an embodiment of the invention is shown in FIG. 2D. In this embodiment, link tool 220 comprises a plurality of cell posts 222 disposed on base plate 224. Cell posts 222 are hollow and may be filled with adhesive. Adhesive may be dispensed from cell posts 222 via a plurality of through post holes 226 formed along the vertical edges of cell posts 222 as shown in FIG. 2D. According to an embodiment, four adjacent aligned socket cells 200 define cavity 216 (as shown in FIG. 2C). Cell posts 222 assume the shape of cavity 216. Cell posts 222 also act as an alignment feature of link tool 220. Cell posts 222 are disposed at locations on base plate 224 and in an orientation corresponding to cavities 216. In this embodiment of link tool 220, the base length and width of cell post 222 are slightly narrower than the length and width of cavity 216. As shown in FIG. 2E, the difference between base dimensions of cell posts 222 and cavity 216 creates narrow cavity 216 between vertical walls 208 of adjacent insulative bodies 202 as well as between cell posts 222 and vertical walls 208 facing cell posts 222. In an embodiment, the base length and width of cell posts 222 may each be designed to be 5-10% narrower than the length and width of cavity 216. Through paddle holes 228 are formed on base plate 224 at locations between adjacent cell posts 222 as shown in FIG. 2D. When socket cells 200 are placed on link tool 220, contact paddles 210 of socket cells 200 slot through paddle holes 228 and protrude from the bottom surface of base plate 224. In an embodiment of link tool 220, the actual base length and width of paddle holes 228 may be slightly larger than the dimensions of contact paddles 210 so that socket cells 200 can be easily removed from link tool 220. In an embodiment, paddle holes 228 may have the shape of contact paddles 210 and are 10-15% larger than the dimensions of contact paddles 210.

When aligning socket cells 200, socket cells 200 are placed on link tool 220 as shown in FIG. 2E. FIG. 2E illustrates the top view of one corner of link tool 220 with socket cells 200 placed on link tool 220 according to an embodiment of the invention. Socket cells 200 are placed in the spaces between cell posts 222. Cell posts 222 act as an alignment feature of link tool 220. According to an embodiment of the invention, socket cells 200 are placed on link tool 220 such that contact tips 206 point to a common direction. Cell posts 222 fill cavities 216 defined by adjacent insulative bodies 202 of socket cells 200. In the embodiment shown in FIG. 2E, cell post 222a fills cavity 216 defined by adjacent insulative bodies 202a, 202b, 202c, 202d of four aligned socket cells 200a, 200b, 200c, 200d. In an embodiment, contact paddles 210 of socket cells 200 protrude from the bottom surface of base plate 224 via paddle holes 228 while bottom surface 214 of insulative bodies 202 rests on base plate 224. In an embodiment of link tool 220, link tool walls 230 border the edges of link tool 220 (as shown in FIG. 2D). Link tool walls 230 stand above the surface of base plate 224 and provide support to socket cells 200 directly adjacent to link tool walls 230. In an embodiment, link tool walls 230 may have wall protrusions 232 as shown in FIG. 2E. Wall protrusions 232 match the contour of insulative bodies 202 directly adjacent to link tool walls 230 and assist alignment of socket cells 200 placed on link tool 220.

Aligned socket cells 200 may be adhered to retain the monolithic body as shown in FIG. 2C. In an embodiment, socket cells 200 may be adhered by way of an initial temporary bonding followed by a permanent bonding. In this embodiment, insulative bodies 202 may be coated with a heat-activated adhesive. When insulative bodies 202 coated with heat-activated adhesive are brought into contact at or around room temperature, for example when socket cells 200 are being aligned using link tool 220, an initial non-permanent adhesion may be formed between insulative bodies 202. The non-permanent bonding may temporarily hold socket cells 200 together as a monolithic body. Subsequently, permanent bonding may be formed between insulative bodies 202 when the monolithic body is subject to an elevated temperature range, for example during solder reflow process. In an alternate embodiment, socket cells 200 may be permanently adhered without the initial temporary bonding. In this embodiment, insulative bodies 202 may be coated with adhesive that cures completely at or near room temperature.

According to an embodiment, link tool 220 may be employed to simultaneously align socket cells 200 and coat insulative bodies 202 with adhesive. Referring to FIG. 2E, cell posts 222 are hollow and may be filled with adhesive. In an embodiment, the length and width dimensions of cell posts 222 are slightly smaller than the corresponding dimensions of cavity 216. As such, a portion of cavity 216 between insulative bodies 202 may remain unoccupied by cell posts 222 (as shown in FIG. 2E). When socket cells 200 are placed in between cell posts 222, adhesive may be dispensed via post holes 226 into cavity 216 unoccupied by cells posts 222. Cavity 216 may be readily filled with adhesive dispensed from post holes 226 of cell posts 222. Adhesive may flow into cavity 216 between vertical walls 208 of insulative bodies 202 and coat insulative bodies 202. When adhesive is cured, adhesion between insulative bodies 202 is formed and a monolithic body comprising socket cells 200 may be attained. The monolithic body of socket cells 200 may then be removed from link tool 220.

Figure 3A:
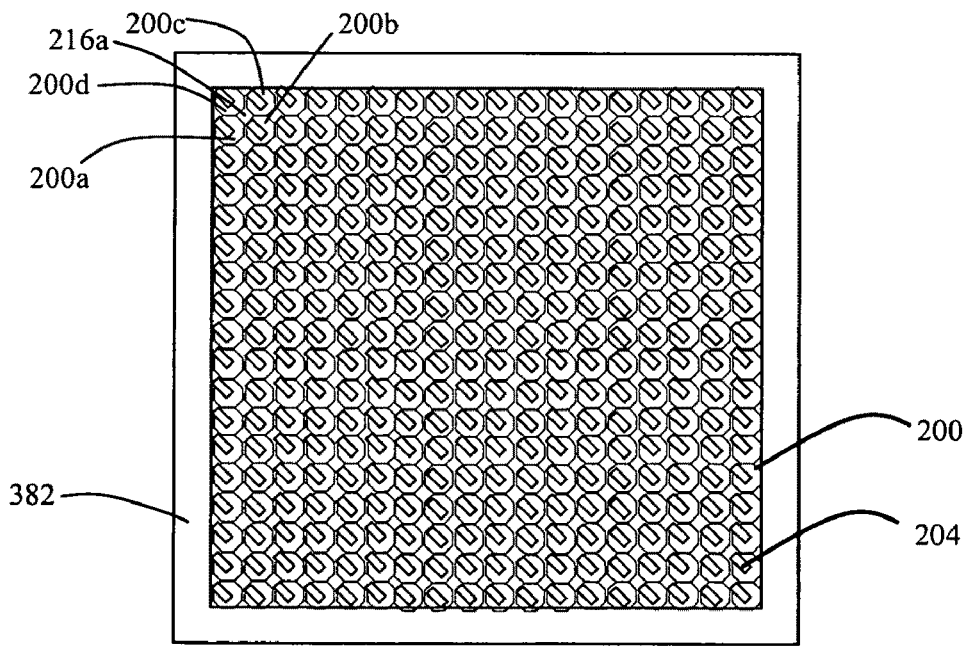
FIG. 3A illustrates the top view of a plurality of aligned socket cells placed in a socket frame according to an embodiment of the invention.
Figure 3B:
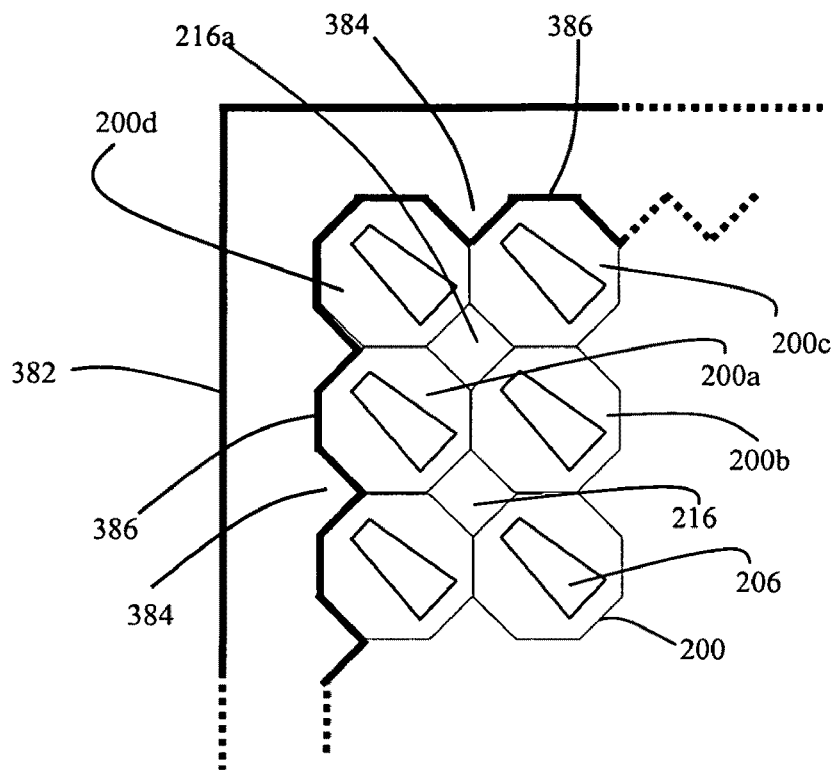
FIG. 3B illustrates the top view of a corner of a socket frame housing a plurality of aligned socket cells according to an embodiment of the invention.

Socket cells 200 may be placed within socket frame 382 as shown in FIG. 3A. Socket frame 382 provides mechanical support to socket cells 200. FIG. 3B illustrates the top view of a corner of socket frame 382 containing aligned socket cells 200 within socket frame 382 according to an embodiment of the invention. In this embodiment, socket cells 200 have octagonal insulative bodies 202. The edges of respective insulative bodies 202 of socket cells 200a, 200b, 200d are directly adjacent to socket frame 382 and form a contour of non-planar line 386. Socket frame 382 has frame protrusions 384 along the edges of socket frame 382. Frame protrusions 384 assist aligned socket cells 200 such as socket cells 200a, 200c, 200d (as shown in FIG. 3B) to align with socket frame 382. The inside surface of socket frame 382 has a plurality of V-shaped frame protrusions 384. The contour of V-shaped frame protrusions 384 matches non-planar line 386 of insulative bodies 202 directly adjacent to socket frame 382.

Figure 3C:
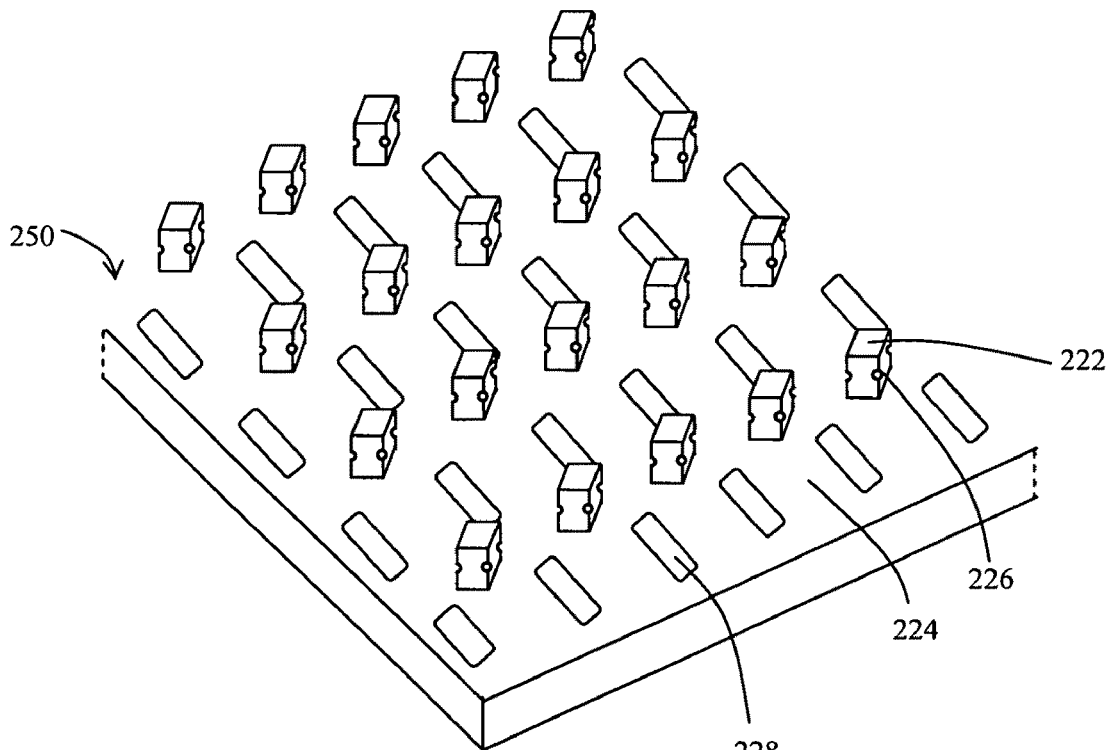
FIG. 3C illustrates the perspective view of a second embodiment of link tool to align socket cells according to an embodiment of the invention.

Aligned socket cells 200 placed within socket frame 382 are adhered to socket frame 382 to form an LGA socket assembly according to an embodiment of the invention. In an embodiment, socket cells 200 are first aligned using link tool 220 (as shown in FIG. 2D) and adhered together to form a monolithic body of socket cells 200 as shown in FIG. 2C. Subsequently, the monolithic body of socket cells 200 is adhered to socket frame 382. In another embodiment of the invention, socket cells 200 are simultaneously aligned, placed within and adhered to socket frame 382 using another embodiment of link tool 250 shown in FIG. 3C. Link tool 250 as depicted in FIG. 3C differs from link tool 220 in FIG. 2D in that link tool 250 in does not have link tool walls 230. In this embodiment and referring to FIG. 3D, socket frame 382 is placed on link tool 250. Then, socket cells 200 are placed in spaces between cell posts 222 of link tool 250. Adhesive may be dispensed from post holes 226 of cell posts 222 into cavity 216 between insulative bodies 202 as well as cavity 216 between the inside surface of socket frame and vertical walls 208 of insulative bodies 202 directly adjacent to socket frame 382.

Figure 3D:
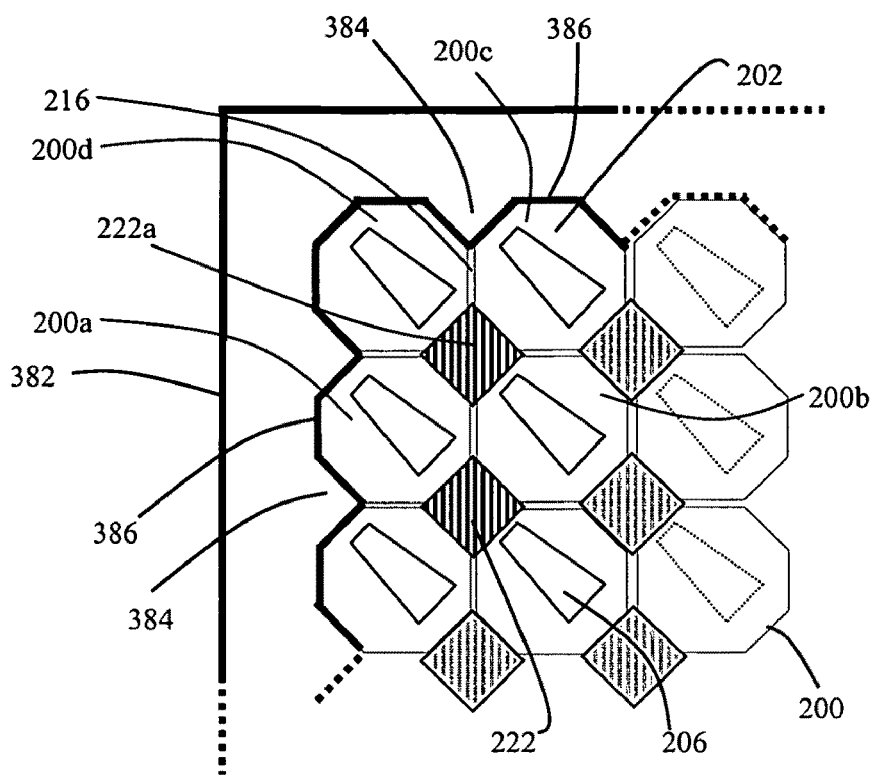
FIG. 3D illustrates the top view of a socket frame and socket cells placed on the second embodiment of link tool according to an embodiment of the invention.
Figure 3E:
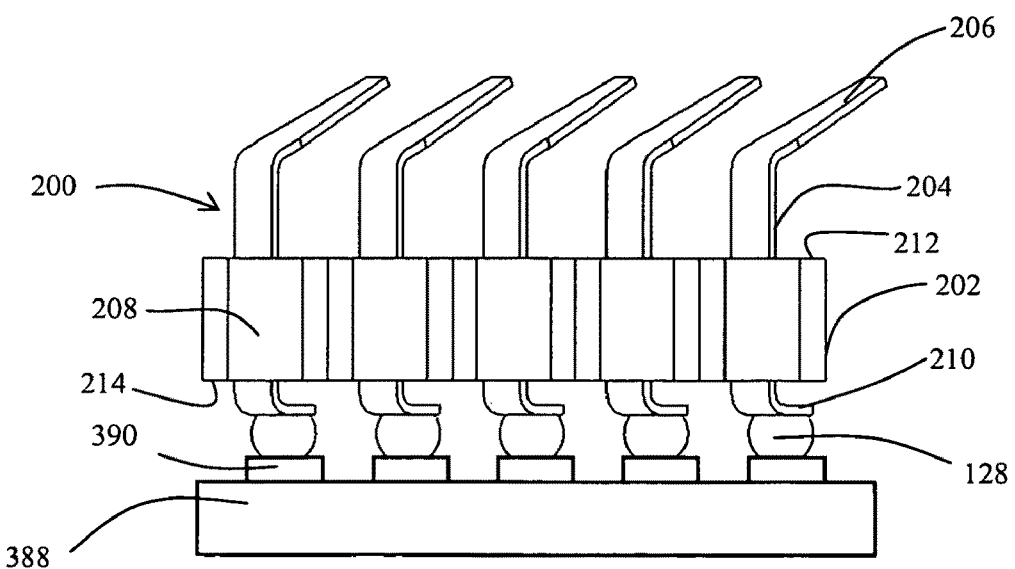
FIG. 3E illustrates the side view of a plurality aligned socket cells attached to a circuit board according to an embodiment of the invention.

In an embodiment of the invention, solder balls 128 are soldered to contact paddles 210 of aligned socket cells 200. Solder balls 128 connect the monolithic body of socket cells 200 to circuit board 388 as shown in FIG. 3D. FIG. 3D illustrates the side view of a plurality of aligned socket cells 200 (socket frame 382 not shown) attached to circuit board 388 via solder balls 128.

Figure 1A:
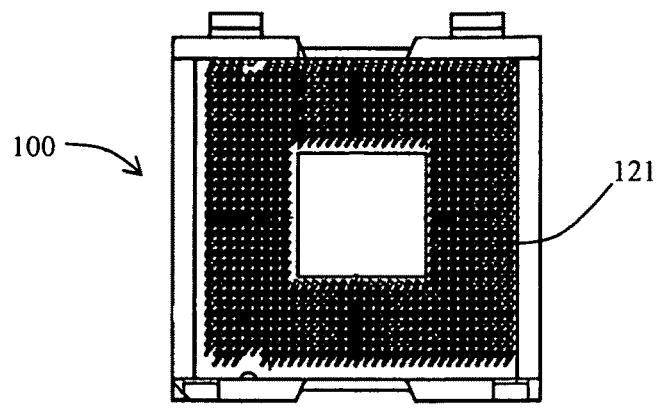
FIG. 1A illustrates the top view of a known LGA socket housing.
Figure 1B:
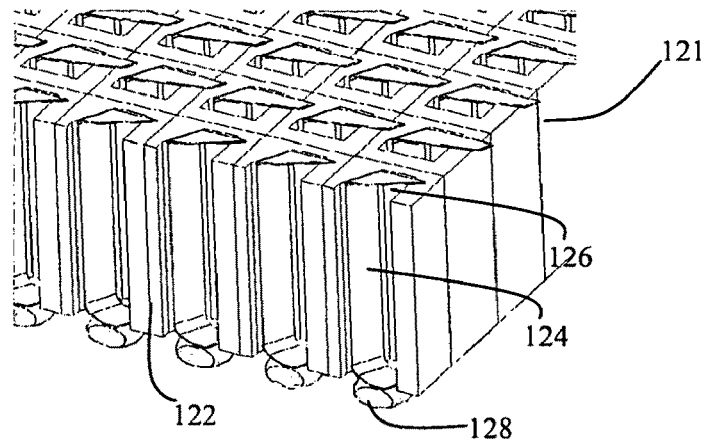
FIG. 1B illustrates the perspective view of a known LGA contact carrier with contacts.
Figure 1C:
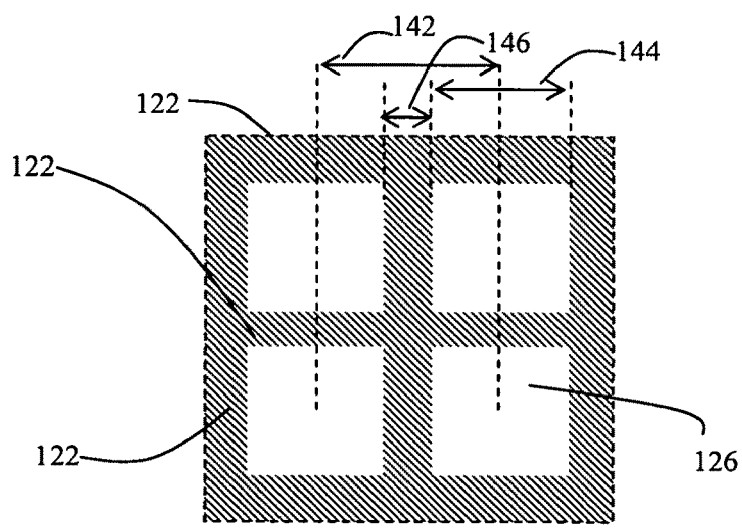
FIG. 1C illustrates the top view of adjacent pockets and socket pitch of a known LGA contact carrier (contacts not shown)
Figure 3F:
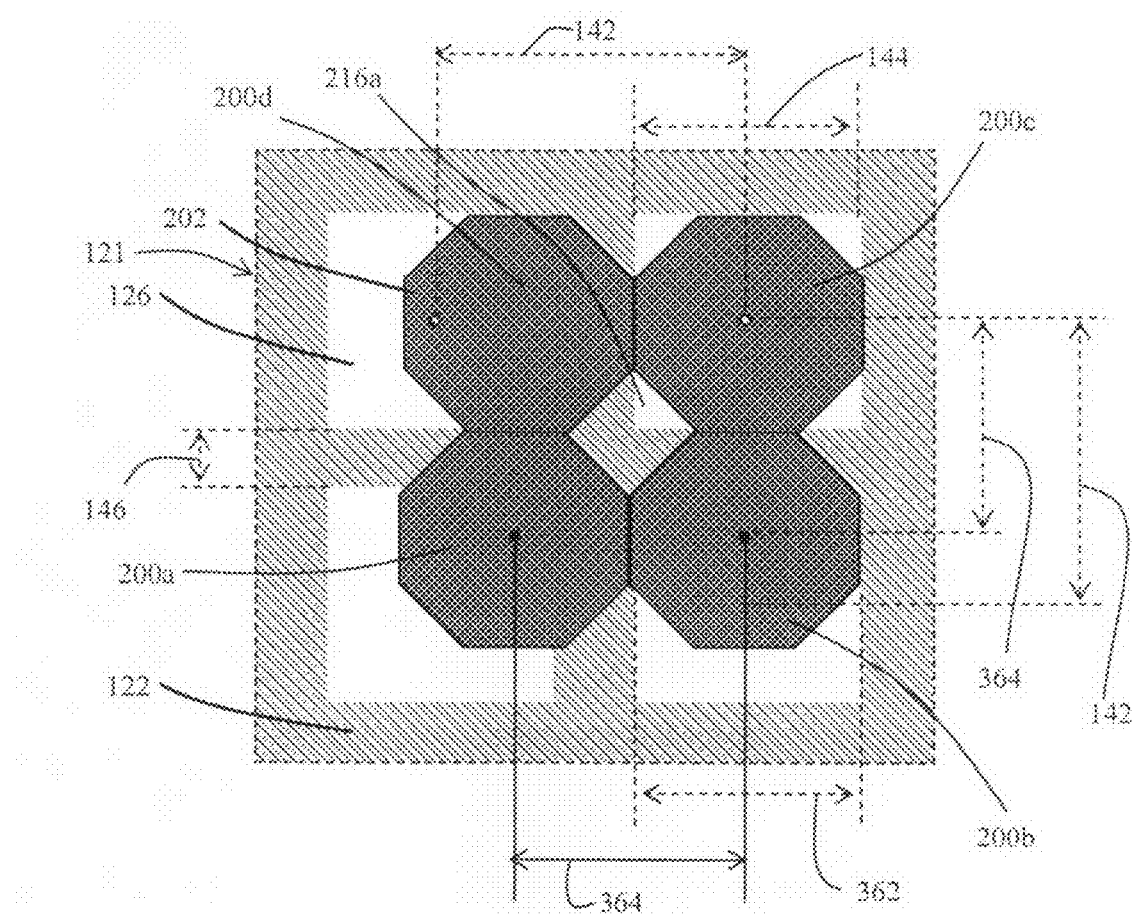
FIG. 3F illustrates the top view of an LGA socket assembly according to an embodiment of the present invention superimposed on the top view of a known LGA socket to compare the effective socket pitch reduction.

FIG. 3F illustrates the comparison of effective socket pitch between a known LGA socket and an LGA socket according to an embodiment of the invention. In FIG. 3F, FIG. 1C (the pitch diagram of a known LGA socket) is superimposed with the top view of socket cells 200 according to an embodiment of the invention. In this embodiment, socket cells 200 have octagonal insulative bodies 202 (contacts 204 are not shown for better clarity). Insulative bodies 202 have axial length 362 of same value with pocket width 144 of known LGA socket carrier 100. Socket pitch 364 of this embodiment of the invention is effectively smaller than socket pitch 142 of known LGA socket carrier 100. Hence, socket assembly of the present invention may house more socket cells 200 as compared to a known LGA socket of same package footprint.

Figure 4:
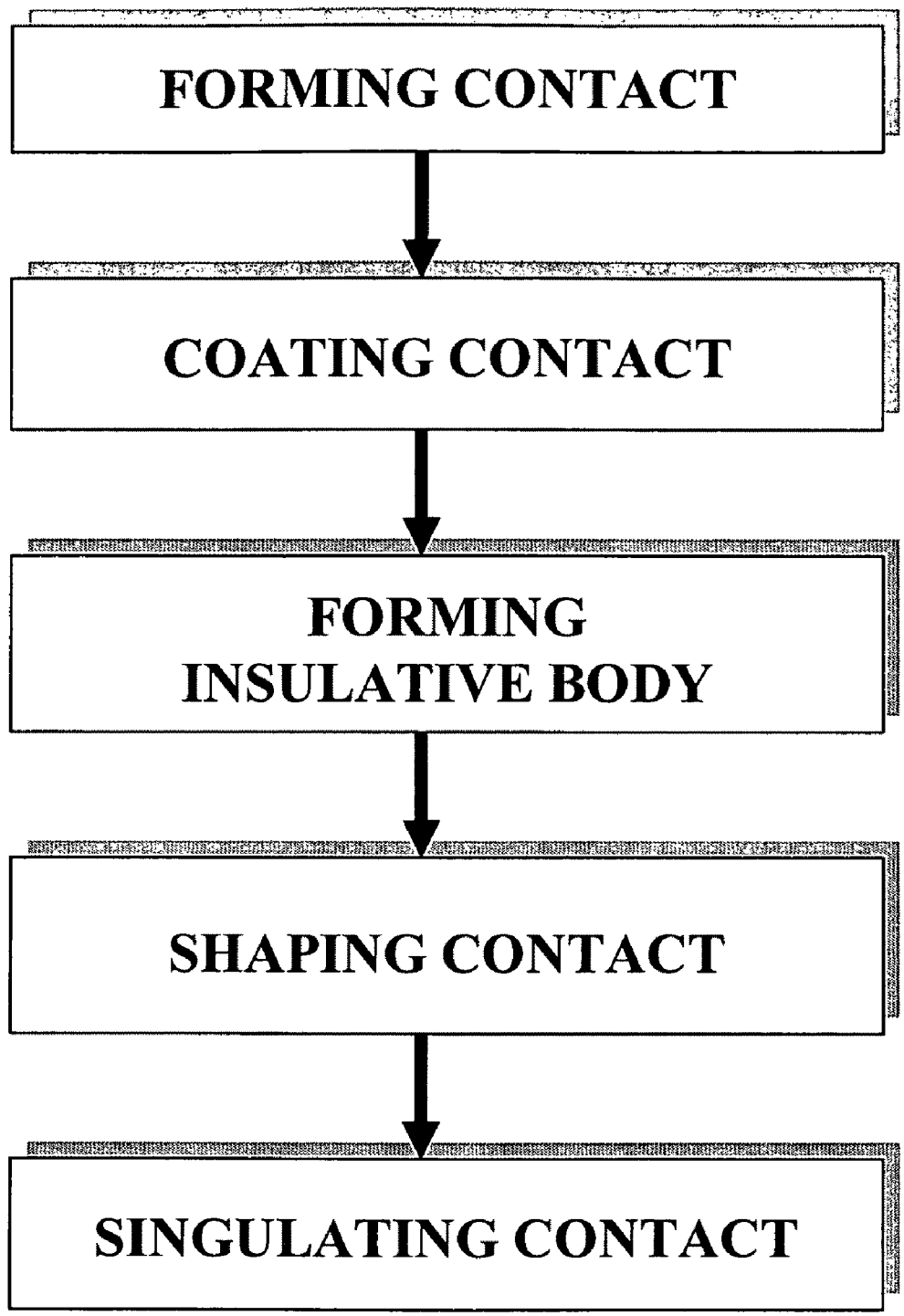
FIG. 4 illustrates a flowchart of the method of fabrication of socket cells according to an embodiment of the invention.

FIG. 4 illustrates a flowchart of the method of making socket cells 200 according to an embodiment of the invention. According to this embodiment, a wire is first formed and then coated with a layer of metal or metal alloy. A plurality of insulative bodies is formed around the wire. In this embodiment, a chain of a plurality of insulative bodies interlinked with a wire is obtained. The wire is subsequently shaped according to the desired design. Finally, the wire is singulated and individual socket contacts are obtained. A more detailed description of the steps according to an embodiment of the invention is provided below and illustrated in FIGS. 5A through 5E.

Figure 5A:
FIG. 5A illustrates the side view of a wire in the "Forming Contact" step of the method of fabrication of socket cells according to an embodiment of the invention.
Figure 5B:
FIG. 5B illustrates the side view of a coated wire in the "Coating Contact" step of the method of fabrication of socket cells according to an embodiment of the invention.

Referring to FIG. 5A, wire 510 is first formed. Wire 510 eventually becomes contact 204 of socket cell 200 as shown in FIGS. 2A and 2B. According to an embodiment of the invention, wire 510 is formed from wire extrusion process. In an embodiment, wire 510 may be made from copper alloy. Wire 510 may be coated with metal or metal alloy so that wire 510 will possess desired mechanical and electrical properties. According to an embodiment, wire 510 may be coated with nickel or nickel alloy. FIG. 5B shows an embodiment of wire 510 coated with a layer of metal or metal alloy 512.

Figure 5C:
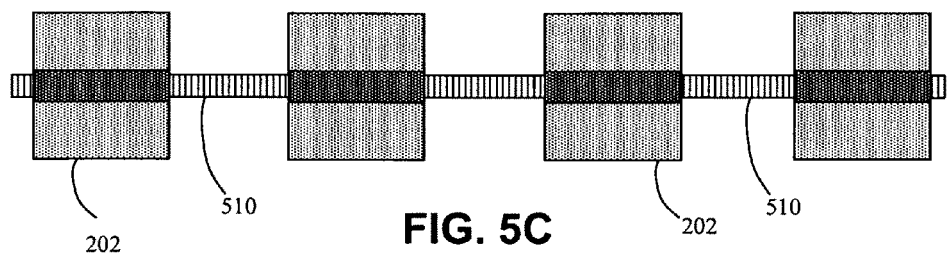
FIG. 5C illustrates the side view of a plurality of insulative bodies formed around a wire in the "Forming Insulative Body" step of the method of fabrication of socket cells according to an embodiment of the invention.

Referring now to FIG. 5C and according to an embodiment of the present invention, a plurality of insulative bodies 202 is formed around wire 510. Different methods may be employed to form insulative bodies 202 around wire 510. According to a first embodiment, insulative bodies 202 are formed via a mold injection process. In a second embodiment, insulative bodies 202 are formed by adhering two identical halves of insulative body 202 around wire 510. In a third embodiment, insulative bodies 202 are formed by wrapping an insulative material around wire 510 until the shape and dimension of insulative bodies 202 are attained.

Figure 5D:
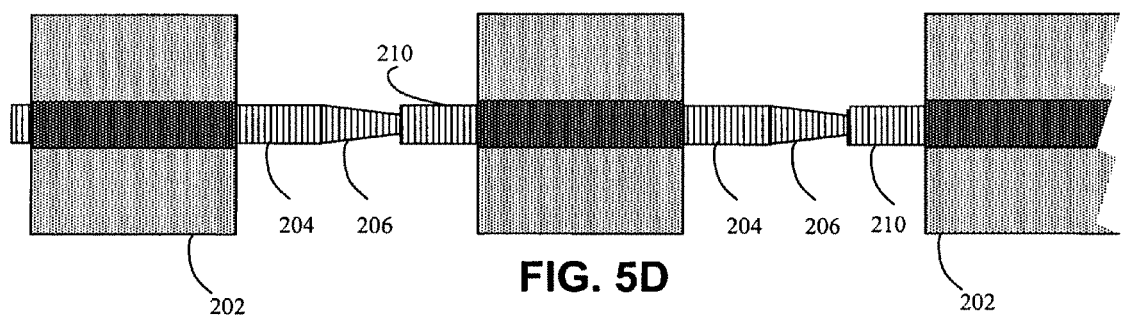
FIG. 5D illustrates the side view of a shaped wire linking a plurality of insulative bodies in the "Shaping Contact" step of the method of fabrication of socket cells according to an embodiment of the invention.

After forming insulative bodies 202 around wire 510, portions of wire 510 between the insulative bodies 202 are shaped to the desired designs of contact tip 206 and contact paddle 210. In an embodiment, contact tip 206 and contact paddle 210 are shaped prior to singulation. FIG. 5D illustrates the side view of an embodiment of shaped wire 510 linking a plurality of insulative bodies 202 with cantilever-type contact tip 206 and J-lead contact paddle 210. According to an embodiment of the invention, portions of wire 510 linking insulative bodies 202 have uniform length. Uniform length of wire 510 between insulative bodies allows identical socket cells 200 to be produced. Identical sockets cells 200 will have uniform contact 204 length. Identical socket cells 200 when aligned may form a monolithic body of socket cells 200 (as shown in FIGS. 2C and 3A) having uniform socket pitch 364. In an embodiment, shaping wire 510 comprises two steps, i.e. trimming and bending. During trimming, portions of wire 510 are trimmed according to the designs and dimensions of contact tip 206 and contact paddle 210. During bending, portions of wire 510 are bent according to the designs of contact tip 206 and contact paddle 210. In an embodiment, trimming and bending may be performed simultaneously. In another embodiment, trimming may be performed either before or after bending.

Figure 5E:
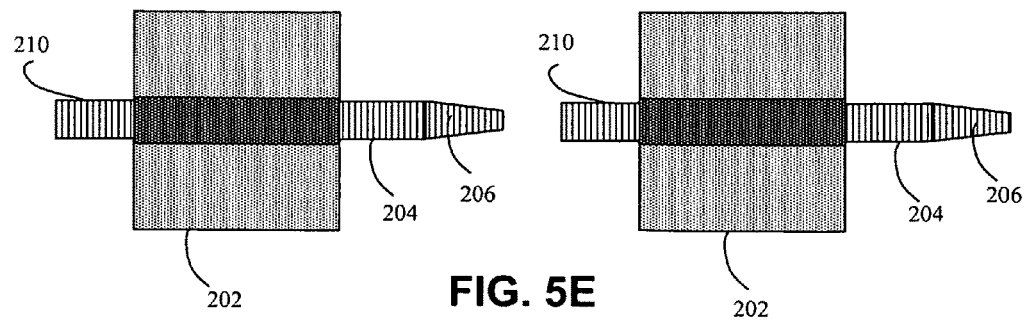
FIG. 5E illustrates the side view of individual socket cells after singulating the wire in the "Singulating Contact" step of the method of fabrication of socket cells according to an embodiment of the invention.

Insulative bodies 202 linked by contact 204 are singulated along contact 204 to produce individual socket cells 200. In an embodiment, singulation takes place after shaping contact 204. In an alternate embodiment, singulation is performed prior to shaping contact 204. During singulation, a portion of contact 204 linking insulative bodies 202 is cut. The singulation on contact 204 produces individual and identical socket cells 200 with independent contact tip 206 and contact paddle 210. FIG. 5E illustrates two socket cells 200 after singulated at a portion between contact tip 206 of a first socket cell 200 and contact paddle 210 of adjacent second socket cell 200.

Although the present invention is described herein with reference to specific embodiments, many modifications and variations therein will readily occur to those of ordinary skill in the art. Accordingly, all such variations and modifications are included within the intended scope of the embodiments of the present invention as defined by the following claims.

What is claimed is:

1. An land grid array (LGA) socket assembly, comprising:
   a plurality of aligned socket cells, each of the socket cells comprises:
   an insulative body having a top surface and a bottom surface, the insulative body being directly adjacent to one or more insulative bodies of adjacent socket cells; and
   a wire within the insulative body, the wire extending from the top surface of the insulative body at a first portion and from the bottom surface of the insulative body at a second portion.

2. The socket assembly of claim 1, wherein the first portion of the wire includes a cantilever-type contact tip and the second portion of the wire includes a j-lead contact paddle.

3. The socket assembly of claim 2, wherein the insulative body comprises polycarbonate material or liquid crystal polymer.

4. The socket assembly of claim 3, wherein the insulative body has a polygonal shape.

5. The socket assembly of claim 4, wherein the polygonal shape is a hexagon or an octagon.

6. The socket assembly of claim 1, wherein the wire comprises copper alloy.

7. The socket assembly of claim 6, wherein the wire is coated with a metal or metal alloy.

8. The socket assembly of claim 7, wherein the metal is nickel and the metal alloy is a nickel alloy.

9. A method of assembling an LGA socket assembly, comprising:
   aligning a plurality of socket cells to form a monolithic body of socket assembly, each of the plurality of socket cells having an insulative body formed around a wire, the wire extending beyond the insulative body at a first and a second portions; and directly contacting the insulative body of the socket cells to the insulative body of one or more adjacent socket cells.

10. The method of claim 9, wherein each of the plurality of insulative bodies has a plurality of vertical walls, the plurality of vertical walls directly contact with a plurality of vertical walls of adjacent insulative bodies.

11. The method of claim 9, wherein the first portion of the wire of the plurality of socket cells is unidirectional relative to each other.

12. The socket assembly of claim 1, wherein the insulative body is pressed against the one or more insulative bodies of adjacent socket cells.

13. The socket assembly of claim 1, wherein the insulative body is directly coupled to the one or more insulative bodies of adjacent socket cells to form a monolithic body.

14. The socket assembly of claim 1, wherein the insulative body is in direct contact with the one or more insulative bodies of adjacent socket cells.

15. The socket assembly of claim 1, wherein one or more sidewalls of the insulative body is adhered to the sidewalls of the one or more insulative bodies of adjacent socket cells.

16. The socket assembly of claim 1, wherein one or more socket cells is directly adjacent to a housing.

17. The method of claim 9, further comprising pressing the insulative body of the socket cells against the insulative body of the one or more adjacent socket cells.

18. The method of claim 9, further comprising forming adhesion between the insulative body of the socket cells and the insulative body of the one or more adjacent socket cells.

19. The method of claim 9, wherein directly contacting the insulative body of the socket cells to the insulative body of one or more adjacent socket cells includes directly coupling the insulative body of the socket cells to the insulative body of one or more adjacent socket cells.

* * * * *